(12) United States Patent
Peterson

(10) Patent No.: US 6,750,403 B2
(45) Date of Patent: Jun. 15, 2004

(54) RECONFIGURABLE MULTILAYER PRINTED CIRCUIT BOARD

(75) Inventor: Melvin Peterson, Campbell, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/125,246

(22) Filed: Apr. 18, 2002

(65) Prior Publication Data

US 2003/0196832 A1 Oct. 23, 2003

(51) Int. Cl.⁷ ................................................ H05K 1/03
(52) U.S. Cl. ................... 174/255; 174/260; 361/780; 361/794; 361/795
(58) Field of Search ................... 174/260, 262–266; 361/780, 792–795

(56) References Cited

U.S. PATENT DOCUMENTS

| | | | |
|---|---|---|---|
| 5,012,047 A | * | 4/1991 | Dohya ........................ 174/250 |
| 5,363,280 A | * | 11/1994 | Chobot et al. ............... 361/794 |
| 5,847,936 A | | 12/1998 | Forehand et al. |
| 6,172,305 B1 | | 1/2001 | Tanahashi |
| 6,184,477 B1 | * | 2/2001 | Tanahashi .................... 174/261 |
| 6,198,635 B1 | | 3/2001 | Shenoy et al. |
| 6,218,631 B1 | * | 4/2001 | Hetzel et al. ................ 174/261 |
| 6,229,095 B1 | * | 5/2001 | Kobayashi ................... 174/255 |
| 6,232,560 B1 | | 5/2001 | Lin |
| 6,261,467 B1 | * | 7/2001 | Giri et al. ..................... 216/13 |
| 6,305,000 B1 | * | 10/2001 | Phan et al. .................... 716/5 |
| 6,388,890 B1 | * | 5/2002 | Kwong et al. ............... 361/780 |

\* cited by examiner

*Primary Examiner*—Evan Pert
*Assistant Examiner*—Jose H. Alcala

(57) ABSTRACT

The present invention is a reconfigurable substrate which includes at least one signal line layer stack. Each signal line layer stack is defined to include two substantially parallel insulating layers and a signal line layer interposed between the two insulating layers and substantially parallel to the insulating layers. The substrate includes at least one conductive isolation layer adjacent to at least one signal line layer stack and substantially parallel to the at least one signal line layer stack. The substrate is reconfigurable to different performance levels by adding or removing at least one conductive isolation layer.

27 Claims, 6 Drawing Sheets

RECONFIGURABLE MULTILAYER PRINTED CIRCUIT BOARD

THE FIELD OF THE INVENTION

The present invention generally relates to multilayer printed circuit boards, and more particularly, to the structure of conductive isolation layers within the multilayer printed circuit boards.

BACKGROUND OF THE INVENTION

Printed circuit boards are used in many types of electronic systems because they provide an efficient means to mount electrical components and to route signals between the components. The range of applications for printed circuit boards varies between low performance, low operating frequency applications to high performance, higher operating frequency applications.

At the higher operating frequencies, printed circuit boards can become more difficult and more expensive to design and manufacture. Interference effects between signal line traces on the same layers and between signal line traces on adjacent layers can become significant. High frequency signals can be reflected by variations in the impedance of the signal line traces which can degrade the quality of the signals being transmitted. Capacitive and inductive cross-coupling can occur between signal line traces which are routed in close proximity.

To improve the performance of the printed circuit boards, power and ground conductive isolation shield layers are often added between adjacent signal line layers on the printed circuit boards. Products targeted for divergent price/performance points incur additional design and manufacturing costs because the printed circuit boards are typically designed for each performance point. Additional costs are incurred as the products are periodically upgraded to incorporate newer components which have higher operating frequencies.

When a new product design is verified, the printed circuit boards used to verify the new product are often times not used for commercial production. When verifying the new designs, the printed circuit boards are typically designed to include a maximum number of power and ground planes to minimize the possibility of the printed circuit boards contributing to any product performance problems which may arise. Once the product is verified, additional costs are incurred when new printed circuit boards are designed and manufactured for the desired performance points.

It is a continuing goal of the electronics industry to reduce the cost of product development and manufacturing. Consequently, approaches which reduce printed circuit board design and development costs are desirable.

SUMMARY OF THE INVENTION

The present invention is a reconfigurable substrate which includes at least one signal line layer stack. Each signal line layer stack is defined to include two substantially parallel insulating layers and a signal line layer interposed between the two insulating layers and substantially parallel to the insulating layers. The substrate includes at least one conductive isolation layer adjacent to the at least one signal line layer stack and substantially parallel to the at least one signal line layer stack. The substrate is reconfigurable to different performance levels by adding or removing the at least one conductive isolation layer.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "leading," "trailing, " etc., is used with reference to the orientation of the Figure(s) being described. As such, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
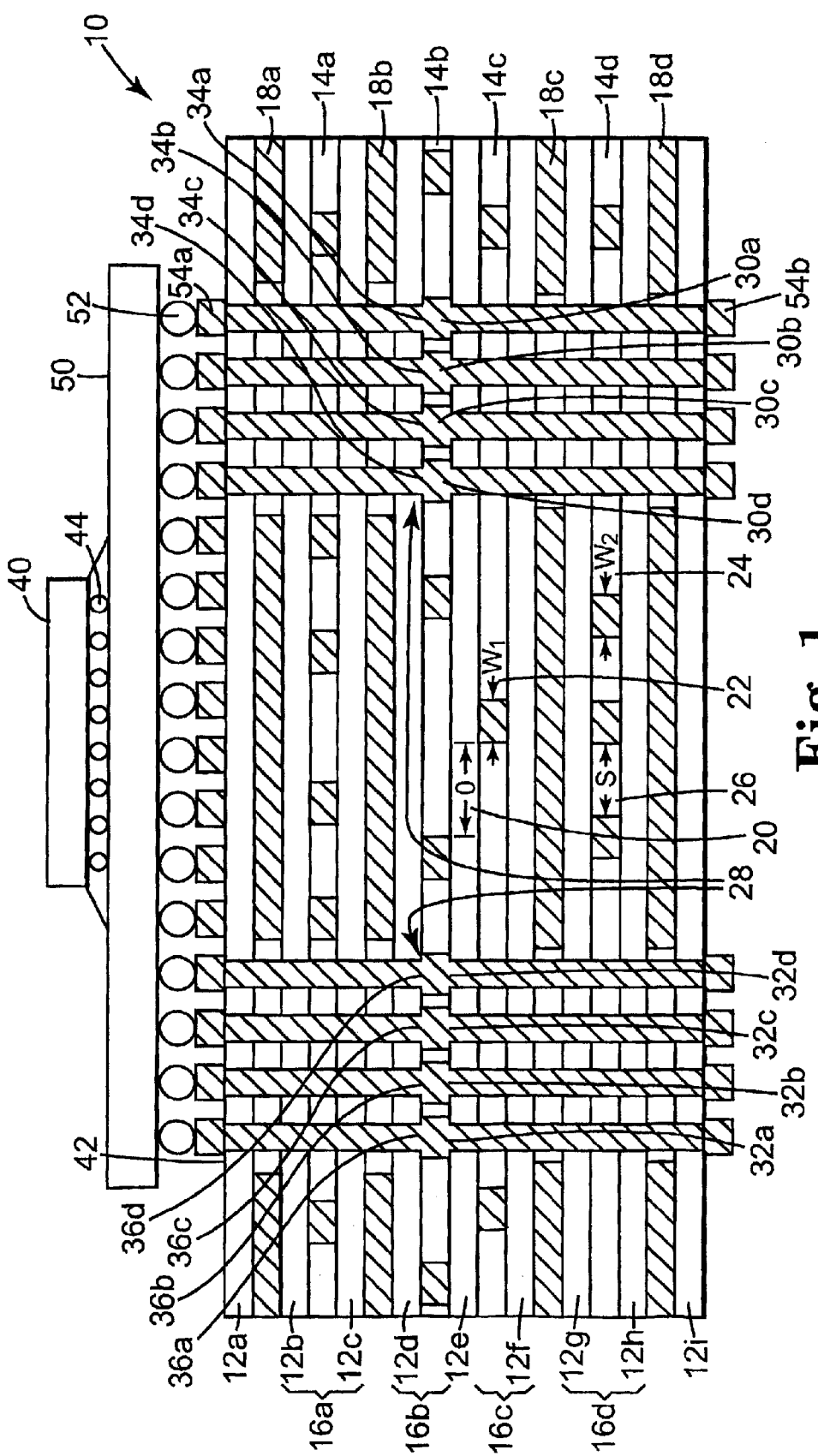
FIG. 1 is a cross-sectional view illustrating an exemplary embodiment of an integrated circuit packaged in a ball grid array package and mounted on the surface of a multilayered printed circuit board.

In the exemplary embodiment illustrated in FIG. 1, an integrated circuit 40 is packaged in a ball grid array (BGA) package 50 and mounted on a surface 42 of a printed circuit board or substrate 10. Integrated circuit 40 is mounted via bumps 44 to ball grid array package 50. Ball grid array package 50 is mounted to pads 54a of printed circuit board 10 by using a high temperature re-flow of solder balls 52. In alternative embodiments, ball grid array package 50 is mounted to pads 54b of printed circuit board 10 by using a high temperature reflow of solder balls 52. Ball grid array package 50 is electrically connected to signal line layers 14 through vias 34 and 36. In various embodiments, integrated circuit 40 can be packaged in a variety of other package types which include, but are not limited to, dual inline packages, quad flat pack packages, and pin grid array packages, which are either direct attach or surface mount socket type packages.

In one embodiment, substrate 10 is designed using a workstation which utilizes specialized computer aided design software to define the routing for individual layers within the substrate 10. Once the design is complete, electronic design verification is performed to ensure the layers are routed as intended and to ensure all design specifications have been met. After verification is finished, the layers are manufactured by completing steps which include, but are not limited to, cleaning, photoresist deposition, photoresist exposure, developing, etching, photoresist stripping, inspection, oxide and testing. The layers are then combined into a multilayer substrate via a lamination process. The final manufacturing steps performed on the multilayer substrate include, but are not limited to, drilling, through-hole plating, cleaning, photoresist deposition, photoresist exposure, developing, plating, photoresist stripping, outer layer etching and tin stripping.

In the exemplary embodiment illustrated in FIG. 1, substrate 10 is constructed of a number of layers which include insulating layers 12, signal line layers 14 and conductive isolation layers 18. In one embodiment, insulating layers 12 are used to dielectrically isolate adjacent signal line layers 14 and are formed from an epoxy laminate. In one embodiment, insulating layers 12 have a dielectric constant in the range of two to six. In other embodiments, insulating layers 12 are formed of other materials which include, but are not limited to, fluororesins, polyimide resins and epoxy resins. In various embodiments, insulating layer 12 has a thickness in the range of 2 mils to 32 mils. In other embodiments, other thicknesses of insulating layer 12 are used. Insulating layers 12 are illustrated in FIG. 1 as layers 12a through 12i.

In one embodiment, signal line layers 14 are conductive layers used to route signals within substrate 10. Because individual signal lines are typically used to route signals within the signal line layers 14, the signal lines may alternatively be referred to as traces, and the signal line layers 14 may alternatively be referred to as trace layers 14. In one embodiment, the signals routed within signal line layers 14 include, but are not limited to, data, address, clock and control. In one embodiment, signal line layers 14 are formed of a conductive metal which includes copper. In various embodiments, signal line layers 14 have a thickness in the range of 0.5 mils to 2 mils. Signal line layers 14 are illustrated in FIG. 1 as layers 14a through 14d.

In one embodiment, conductive isolation layers 18 are used to route power and ground planes which help reduce capacitive coupling and electromagnetic interference between signal line layers 14. In one embodiment, conductive isolation layers 18 are formed from a material which includes copper. In various embodiments, conductive isolation layers 18 have a thickness in the range of 0.5 mils to 3 mils. Conductive isolation layers 18 are illustrated in FIG. 1 as layers 18a through 18d. In one embodiment, conductive isolation layers 18a and 18d are ground planes and conductive isolation layers 18b and 18c are power planes. In another embodiment, conductive isolation layers 18a and 18d are power planes and conductive isolation layers 18b and 18c are ground planes.

In the exemplary embodiment illustrated in FIG. 1, insulating layers 12 and signal line layers 14 are arranged to be substantially parallel to each other and to form a number of signal line layer stacks 16. Each signal line layer stack 16 includes a signal line layer 14 interposed between two insulating layers 12. A signal line layer stack illustrated at 16a includes signal line layer 14a interposed between insulating layers 12b and 12c. Likewise, a second signal line layer stack illustrated at 16b includes signal line layer 14b interposed between insulating layers 12d and 12e. A signal line layer stack illustrated at 16c includes signal line layer 14c interposed between insulating layers 12e and 12f. And a signal line layer stack illustrated at 16d includes signal line layer 14d interposed between insulating layers 12g and 12h.

In one embodiment, the routing of the individual signal line layers 14 is restricted in order to reduce capacitive or inductive coupling between the signal line layers 14. In one embodiment, signal line layers 14 which are not separated by conductive isolation layers 18 are restricted to be routed substantially in a same direction with a minimum offset distance (O) as illustrated at 20. In one embodiment, the minimum offset distance (O) is 5 mils.

In one embodiment, signal lines in adjacent signal line layers 14 which are not separated by conductive isolation layers 18 and which are not routed substantially in a same direction are routed in an orthogonal direction (refer to FIG. 7). Orthogonal routing minimizes the capacitive coupling between signal lines by reducing the area between signal lines wherein capacitive coupling can occur.

In various embodiments, the nominal width ($W_1$) illustrated at 22 for signal lines in adjacent signal line layers 14 not separated by conductive isolation layers 18 is the same or approximately the same as the nominal width ($W_2$) illustrated at 24 for signal lines in adjacent signal line layers 14 which are separated by conductive isolation layers 18. In various embodiments, the width ($W_1$) and the width ($W_2$) are set to achieve a desired characteristic impedance.

In one embodiment, the minimum edge to edge spacing (S) illustrated at 26 for signal lines in the same signal line layer 14 is set to a suitable value in order to minimize the capacitive coupling between adjacent signal lines routed in the same signal line layer 14. In one embodiment, the minimum edge to edge spacing (S) illustrated at 26 is 14 mils.

In the exemplary embodiment illustrated in FIG. 1, integrated circuit 40 is coupled to signal lines routed on a single signal line layer 14b. These signal lines are illustrated as signal lines 30a through 30d and signal lines 32a through 32d, wherein signal lines 30 and 32 are routed on the same signal line routing layer 14b within substrate 10. In the exemplary embodiment, signal lines 30 and signal lines 32 are routed in a direction perpendicular to a plane of FIG. 1. Signal lines 30 are electrically coupled to vias 34. Signal lines 32 are electrically coupled to vias 36.

To simplify the description of the present invention, only a limited number of solder balls 52 are shown. In various embodiments, ball grid array packages can have lead counts in the range of 1000 leads or more. Furthermore, only a limited number of signal lines within signal line layers 14 are illustrated. In various embodiments, the number of signal lines routed can be significant in order to route the package leads within the signal line layers.

In various embodiments, substrate 10 is constructed of a higher or lower number of layers which include insulating layers 12, signal line layers 14 and conductive isolation layers 18. Furthermore, in various embodiments, any suitable combination of insulating layers 12, signal line layers 14 and conductive isolation layers 18 are used to form substrate 10.

In the various embodiments disclosed in FIGS. 1–7, the substrates are reconfigurable to different performance levels by adding or removing at least one first conductive isolation layer 18 or at least one second conductive isolation layer 18. In various embodiments, width ($W_1$) and width ($W_2$) are selected so that signal lines in signal line layers 14 have the same or approximately the same width and substantially the same characteristic impedance by using suitable materials, thicknesses and dielectric constants for insulating layers 12. In one embodiment, a difference between the nominal width (W1) and the nominal width ($W_2$) is equal to or less than 10%. In one embodiment, the characteristic impedance is 50 ohms. In another embodiment, the characteristic impedance is 65 ohms.

In various embodiments, when a substrate is reconfigured, the electronic design steps do not have to be repeated for the signal line layers 14 used in the reconfigured substrate. Signal lines in signal line layers 14 having a width defined by width ($W_1$) before being reconfigured and having a width defined by width ($W_2$) after being reconfigured, or having a width defined by width ($W_2$) before being reconfigured and having a width defined by width ($W_1$) after being reconfigured, can be adjusted in width before the photoresist exposure steps by modifying the aperture table and generating a modified mask set to expose signal line layers 14. If the performance level of the reconfigured substrate is increased, one or more additional first conductive isolation layers 18 or one or more additional second conductive isolation layers 18 are added before the lamination process is completed. If the performance level of the reconfigured substrate is decreased, one or more first conductive isolation layers 18 or one or more second conductive isolation layers 18 are removed before the lamination process is completed. To complete manufacturing of the multilayer substrate, steps are completed which can include, drilling, through hole plating, cleaning, photoresist deposition, photoresist exposure, developing, plating, photoresist stripping, outer layer etching and tin stripping.

Figure 2:
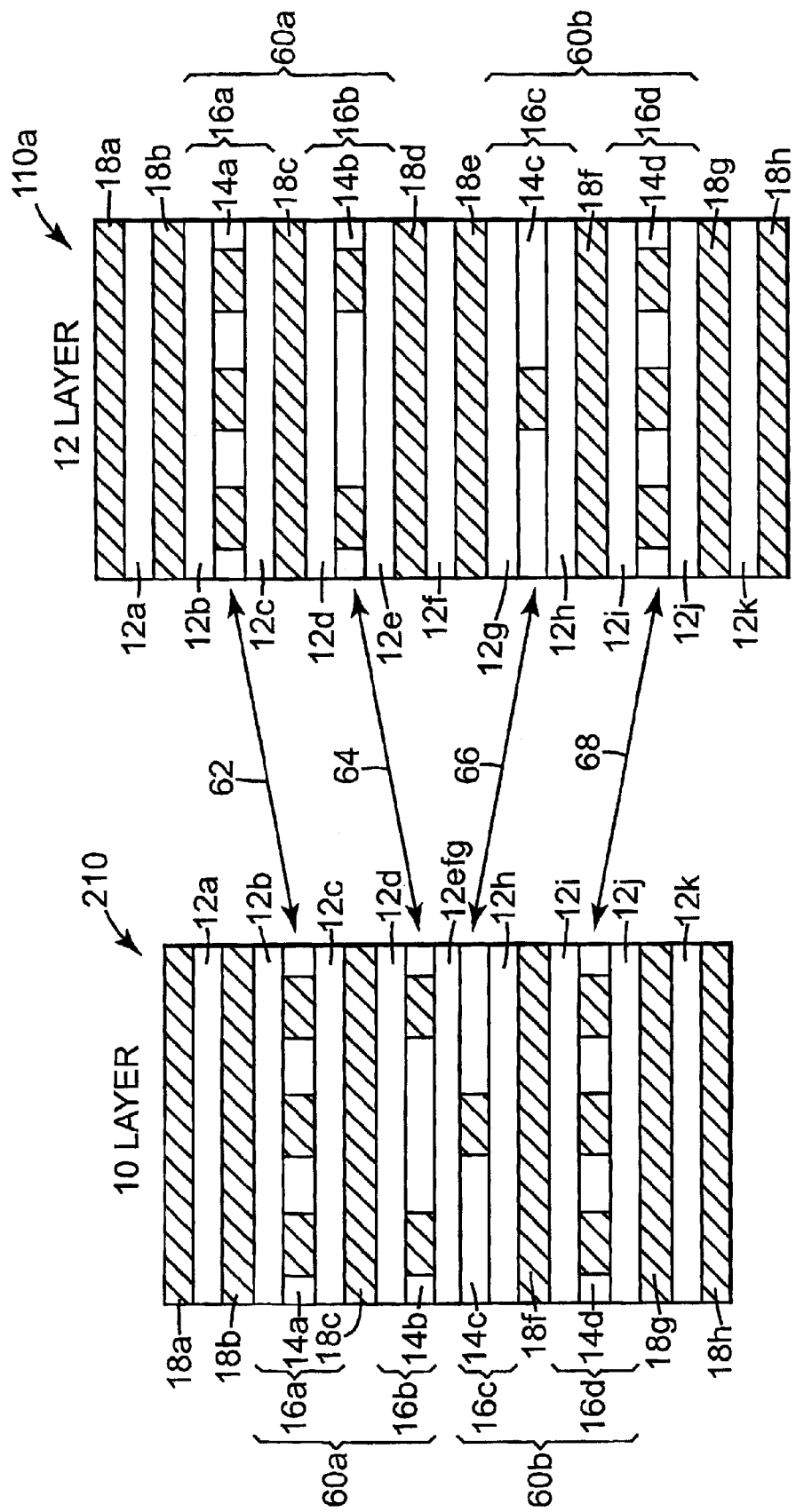
FIG. 2 is a first exemplary embodiment illustrating a reconfigurable substrate being reconfigured between a 10 layer substrate and a 12 layer substrate having the same number of signal layers.

FIG. 2 is a first exemplary embodiment illustrating a reconfigurable substrate being configured between a 10 layer substrate 210 and a 12 layer substrate 110a. In the illustrated embodiment, substrate 110a has signal line layer groups 60a and 60b. In other embodiments, substrate 110a can have one signal line layer group 60, or more than two signal line layer groups 60. In the illustrated embodiment, signal line layer group 60a is separated from adjacent signal line layer group 60b by a first insulating layer 12f. Each signal line layer group 60 includes one or more signal line layer stacks 16. Each signal line layer stack 16 includes one or more signal line layers 14, wherein each signal line layer 14 has a second insulating layer 12 on both a first side and a second side. In substrate 110a, signal line layer stack 16a includes signal line layer 14a and includes second insulating layer 12b on a first side and second insulating layer 12c on a second side of signal line layer 14a. Signal line layer stack 16b includes signal line layer 14b and includes second insulating layer 12d on a first side and second insulating layer 12e on a second side of signal line layer 14b. Signal line layer stack 16c includes signal line layer 14c and includes insulating layer 12g on a first side and insulating layer 12h on a second side of signal line layer 14c. Signal line layer stack 16d includes signal line layer 14d and includes second insulating layer 12i on a first side and second insulating layer 12j on a second side of signal line layer 14d. The first and second insulating layers 12 and the signal line layers 14 are arranged to be substantially parallel to each other.

In the exemplary embodiment, substrate 210 has signal line layer groups 60a and 60b, and has signal line layer stacks 16a through 16d. Arrows 62, 64, 66, and 68 illustrate that signal line layers 14a, 14b, 14c and 14d, respectively, have the same layout in substrate 210 and substrate 110a.

In various embodiments, substrate 110a and substrate 210 are reconfigurable to different performance levels by adding or removing at least one first conductive isolation layer 18 or at least one second conductive isolation layer 18. Each first conductive isolation layer 18 is added to a first side or second side of each of the signal line layer groups 60 and are arranged to be substantially parallel to the signal line layers 14. Each second conductive isolation layer is added between one or more adjacent signal line layer stacks 16 and is arranged to be substantially parallel to the signal line layers 14.

In the exemplary embodiment, substrate 210 is reconfigured to a higher performance level substrate 110a by adding two first conductive isolation layers 18d and 18e. First conductive isolation layer 18d is added to a second side of signal line layer group 60a and is arranged to be substantially parallel to signal line layers 14. First conductive isolation layer 18e is added to a first side of signal line layer group 60b and is arranged to be substantially parallel to signal line layers 14.

In the exemplary embodiment, substrate 110a is reconfigured to a lower performance level by removing one or more of the first conductive isolation layers 18 or removing one or more of the second conductive isolation layers 18. In the exemplary embodiment, substrate 110a is reconfigurable to the lower performance level substrate 210 by removing first conductive isolation layers 18d and 18e. For ease of illustration, substrate 210 indicates the combined insulating layers 12e, 12f and 12g as 12efg.

In an illustrative embodiment, substrate 110a is an 8 layer substrate which does not include first conductive isolation layers 18a, 18b, 18g and 18h. Substrate 210 is a 6 layer substrate which does not include first conductive isolation layers 18a, 18b, 18g and 18h. Substrate 210 is reconfigured to a higher performance level substrate 110a by adding two first conductive isolation layers 18d and 18e. First conductive isolation layer 18d is added to a second side of signal line layer group 60a and is arranged to be substantially parallel to signal line layers 14. First conductive isolation layer 18e is added to a first side of signal line layer group 60b and is arranged to be substantially parallel to signal line layers 14. In the illustrative embodiment, substrate 110a is reconfigurable to the lower performance level substrate 210 by removing first conductive isolation layers 18d and 18e.

In the exemplary embodiment, conductive isolation layers 18a and 18h are constructed of a conductive foil and are not added or removed to reconfigure substrate 110a or substrate 210. In other embodiments, conductive isolation layers 18a and 18h are added or removed to reconfigure substrate 110a or substrate 210.

Figure 3:
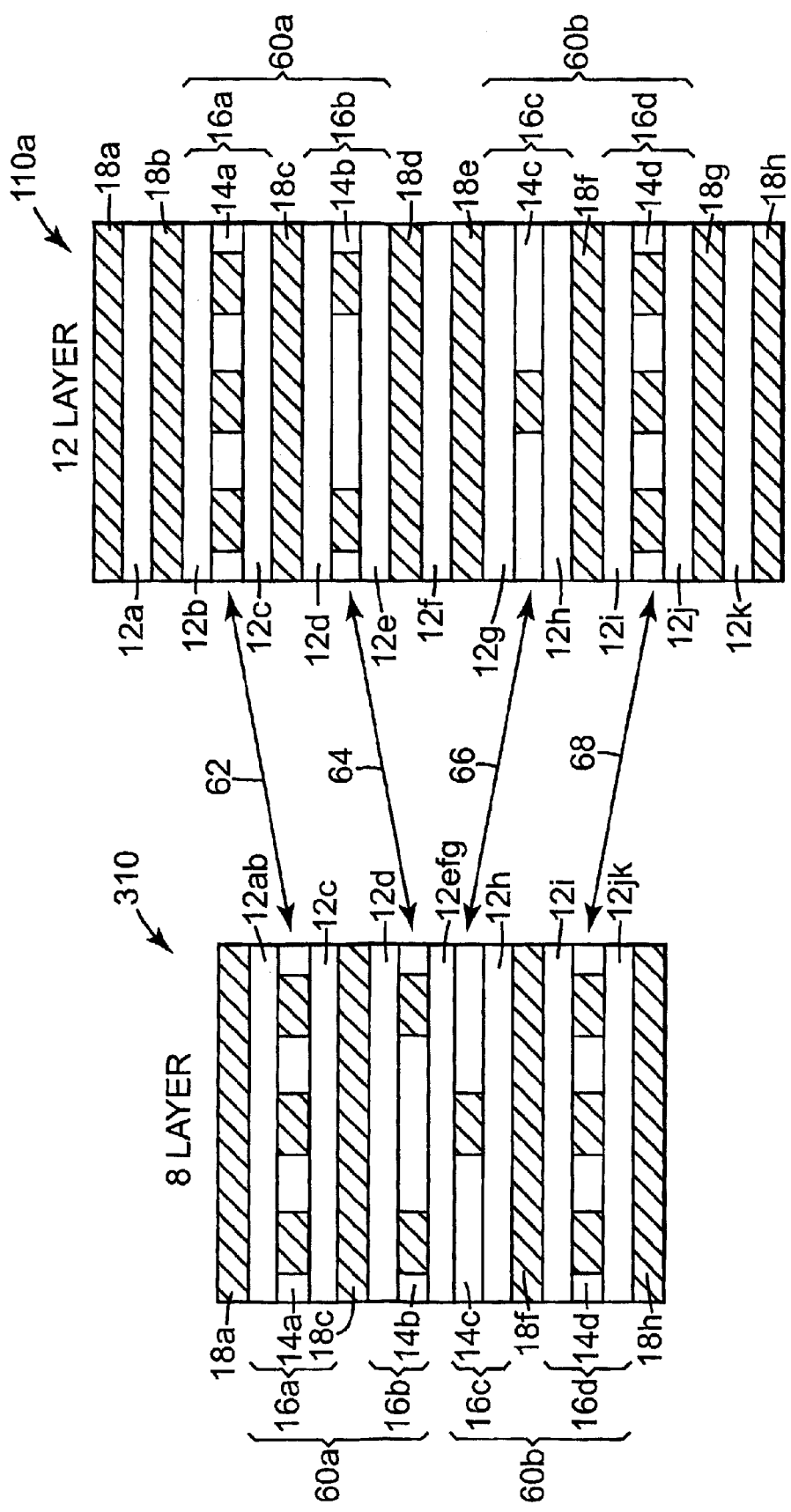
FIG. 3 is a second exemplary embodiment illustrating a reconfigurable substrate being reconfigured between an 8 layer substrate and a 12 layer substrate having the same number of signal layers.

FIG. 3 is a second exemplary embodiment illustrating a reconfigurable substrate being configured between an 8 layer substrate 310 and a 12 layer substrate 110a. In one embodiment, substrate 110a and substrate 310 are reconfigurable to different performance levels by adding or removing at least one first conductive isolation layer 18 or at least one second conductive isolation layer 18. Each first conductive isolation layer 18 is added to a first side or second side of each of the signal line layer groups 60 and is arranged to be substantially parallel to the signal line layers 14. Each second conductive isolation layer is added between one or more adjacent signal line layer stacks 16 and is arranged to be substantially parallel to the signal line layers 14.

In the exemplary embodiment, substrate 310 is reconfigured to the higher performance level substrate 110a by addition of first conductive isolation layers 18b, 18d, 18e and 18g. First conductive isolation layer 18b is added to a first side of signal line layer group 60a and is arranged to be substantially parallel to signal line layers 14. First conductive isolation layer 18d is added to a second side of signal line layer group 60a and is arranged to be substantially parallel to signal line layers 14. First conductive isolation layer 18e is added to a first side of signal line layer group 60b and is arranged to be substantially parallel to signal line layers 14. First conductive isolation layer 18g is added to a second side of signal line layer group 60b and is arranged to be substantially parallel to signal line layers 14.

In the exemplary embodiment, substrate 110a is reconfigured to the lower performance level by removing one or more of the first conductive isolation layers 18 or removing one or more of the second conductive isolation layers 18. In the exemplary embodiment, substrate 110a is reconfigured to substrate 310 by removing conductive isolation layers 18b, 18d, 18e and 18g.

For ease of illustration and to simplify the description of the invention, insulating layers 12a and 12b in substrate 110a are shown as insulating layer 12ab in substrate 310. Insulating layers 12e, 12f and 12g are illustrated as insulating layer 12efg in substrate 310. Insulating layer 12j and 12k in substrate 110a are indicated as insulating layer 12jk in substrate 310.

In the illustrated embodiment, conductive isolation layers 18a and 18h are constructed of a conductive foil and are not added or removed to reconfigure substrate 110a or substrate 310. In other embodiments, conductive isolation layers 18a and 18h are added or removed to reconfigure substrate 110a or substrate 310.

Figure 4:
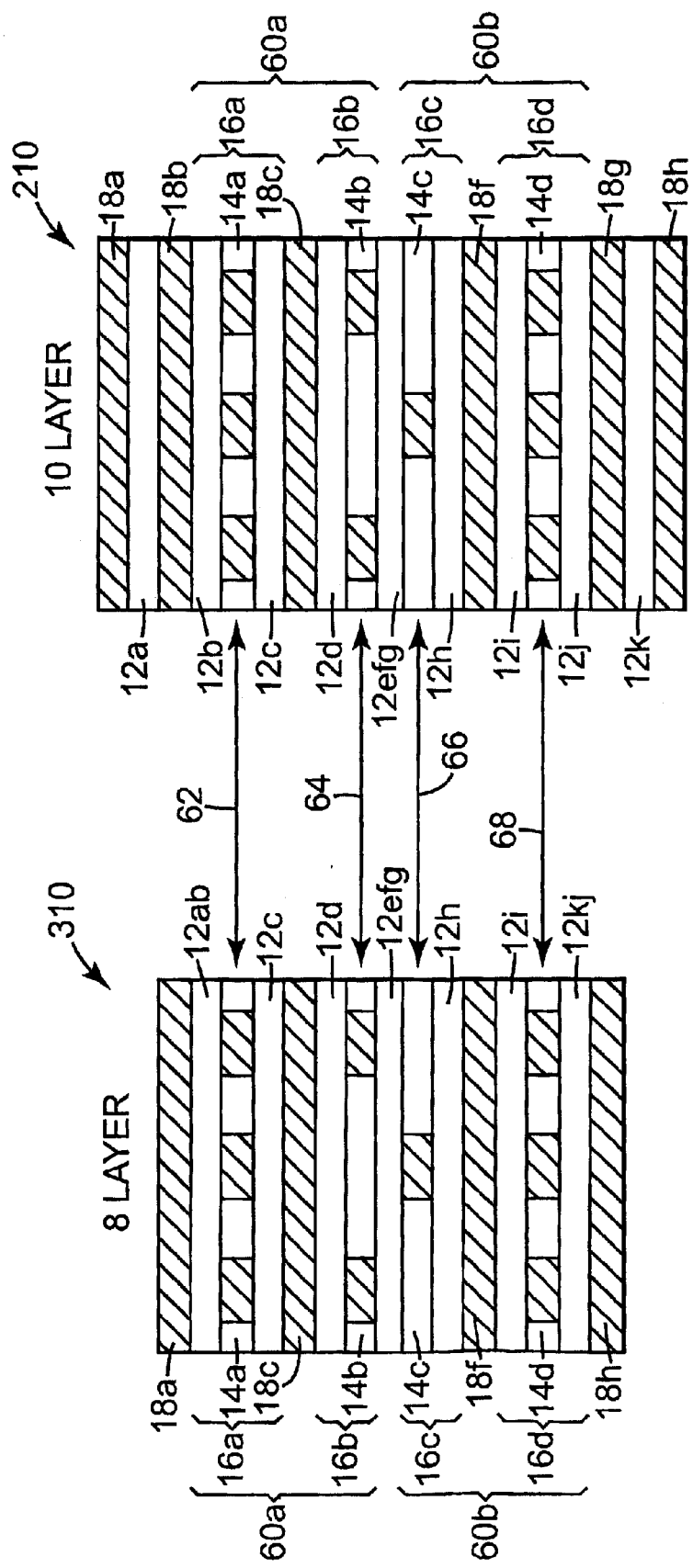
FIG. 4 is a third exemplary embodiment illustrating a reconfigurable substrate being reconfigured between an 8 layer substrate and a 10 layer substrate having the same number of signal layers.

FIG. 4 is a third exemplary embodiment illustrating a reconfigurable substrate being configured between an 8 layer substrate 310 and a 10 layer substrate 210. In one embodiment, substrate 210 and substrate 310 are reconfigurable to different performance levels by adding or removing at least one first conductive isolation layer 18 or at least one second conductive isolation layer 18. Each first conductive isolation layer 18 is added to a first side or second side of each of the signal line layer groups 60 and is arranged to be substantially parallel to the signal line layers 14. Each second conductive isolation layer is added between one or more adjacent signal line layer stacks 16 and is arranged to be substantially parallel to the signal line layers 14.

In the exemplary embodiment, substrate 310 is reconfigured to the higher performance level substrate 210 by adding first conductive isolation layer 18b to a first side of signal line layer group 60a, and by adding first conductor 18g to a second side of signal line layer group 60b. First conductive isolation layers 18b and 18g are arranged to be substantially parallel to signal line layers 14.

In the exemplary embodiment, substrate 210 is reconfigured to the lower performance level by removing one or more of the first conductive isolation layers 18 or removing one or more of the second conductive isolation layers 18. In the exemplary embodiment, substrate 210 is reconfigurable to the lower performance level substrate 310 by removing first conductive isolation layer 18b and first conductive isolation layer 18g.

In the exemplary embodiment, conductive isolation layers 18a and 18h are constructed of a conductive foil and are not added or removed to reconfigure substrate 210 or substrate 310. In other embodiments, conductive isolation layers 18a and 18h are added or removed to reconfigure substrate 210 or substrate 310.

Figure 5:
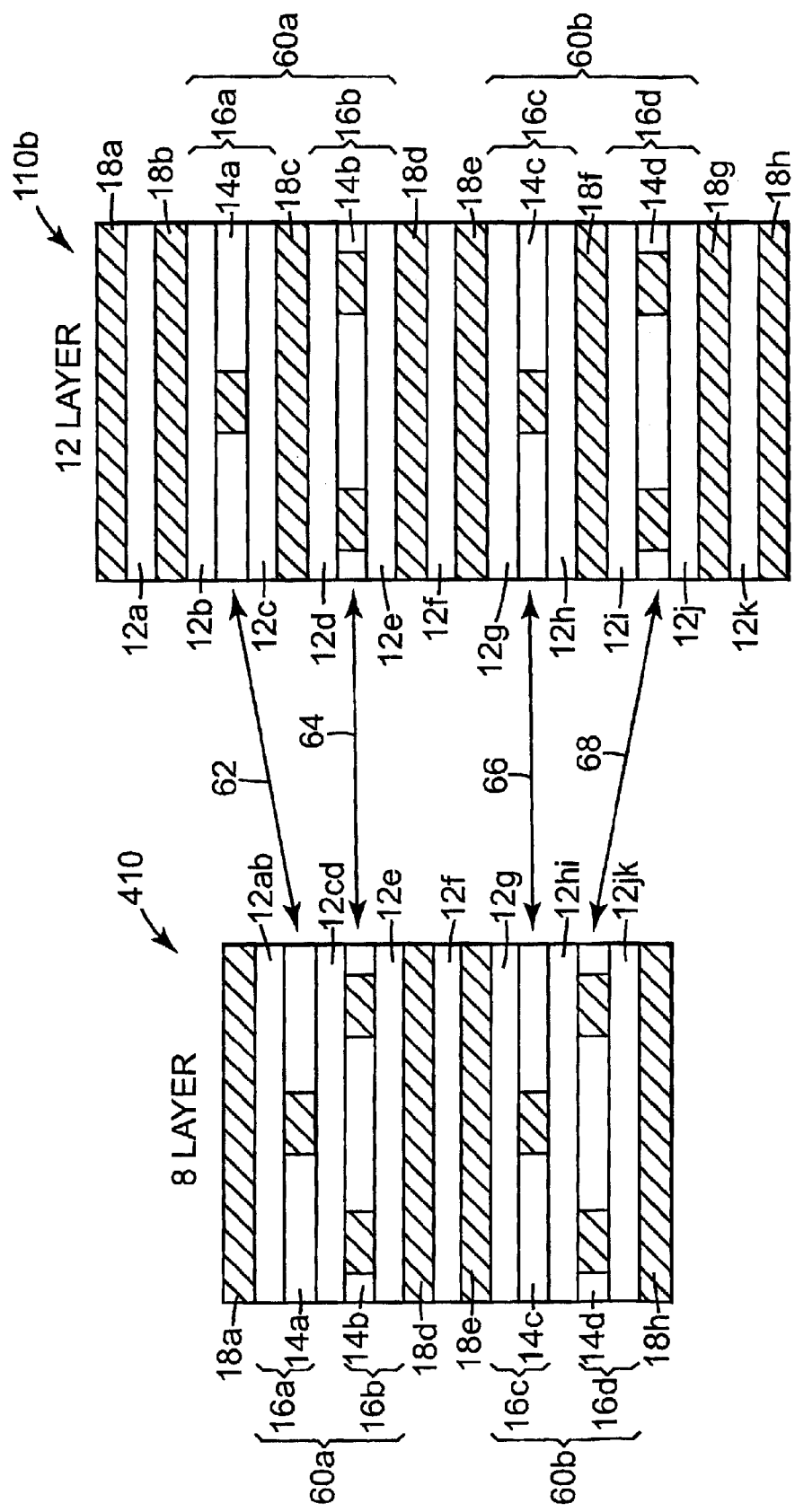
FIG. 5 is a fourth exemplary embodiment illustrating a reconfigurable substrate being reconfigured between an 8 layer substrate and a 12 layer substrate having the same number of signal layers.

FIG. 5 is a fourth exemplary embodiment illustrating a reconfigurable substrate being configured between an 8 layer substrate 410 and a 12 layer substrate 110b. Substrate 110b has the same layer construction as 12 layer substrate 110a, but has a different configuration of signal line layers 14.

In various embodiments, substrate 110b and substrate 410 are reconfigurable to different performance levels by adding or removing at least one first conductive isolation layer 18 or at least one second conductive isolation layer 18. Each first conductive isolation layer 18 is added to a first side or second side of each of the signal line layer groups 60 and is arranged to be substantially parallel to the signal line layers 14. Each second conductive isolation layer is added between one or more adjacent signal line layer stacks 16 and is arranged to be substantially parallel to the signal line layers 14.

In the exemplary embodiment, substrate 410 is reconfigured to the higher performance level substrate 110b by adding second conductive isolation layers 18c and 18f. Second conductive isolation layer 18c is added between adjacent signal line layer stacks 16a and 16b, and is arranged to be substantially parallel to signal line layers 14. Second conductive isolation layer 18f is added between adjacent signal line layer stacks 16c and 16d, and is arranged to be substantially parallel to signal line layers 14.

In the exemplary embodiment, substrate 110b is reconfigured to the lower performance level by removing one or more of the first conductive isolation layers 18 or removing one or more of the second conductive isolation layers 18. In the exemplary embodiment, substrate 110b is reconfigurable to the lower performance level substrate 410 by removing second conductive isolation layers 18c and 18f.

In the exemplary embodiment, conductive isolation layers 18a and 18h are constructed of a conductive foil and are not added or removed to reconfigure substrate 110b or substrate 410. In other embodiments, conductive isolation layers 18a and 18h are added or removed to reconfigure substrate 110b or substrate 410.

Figure 6:
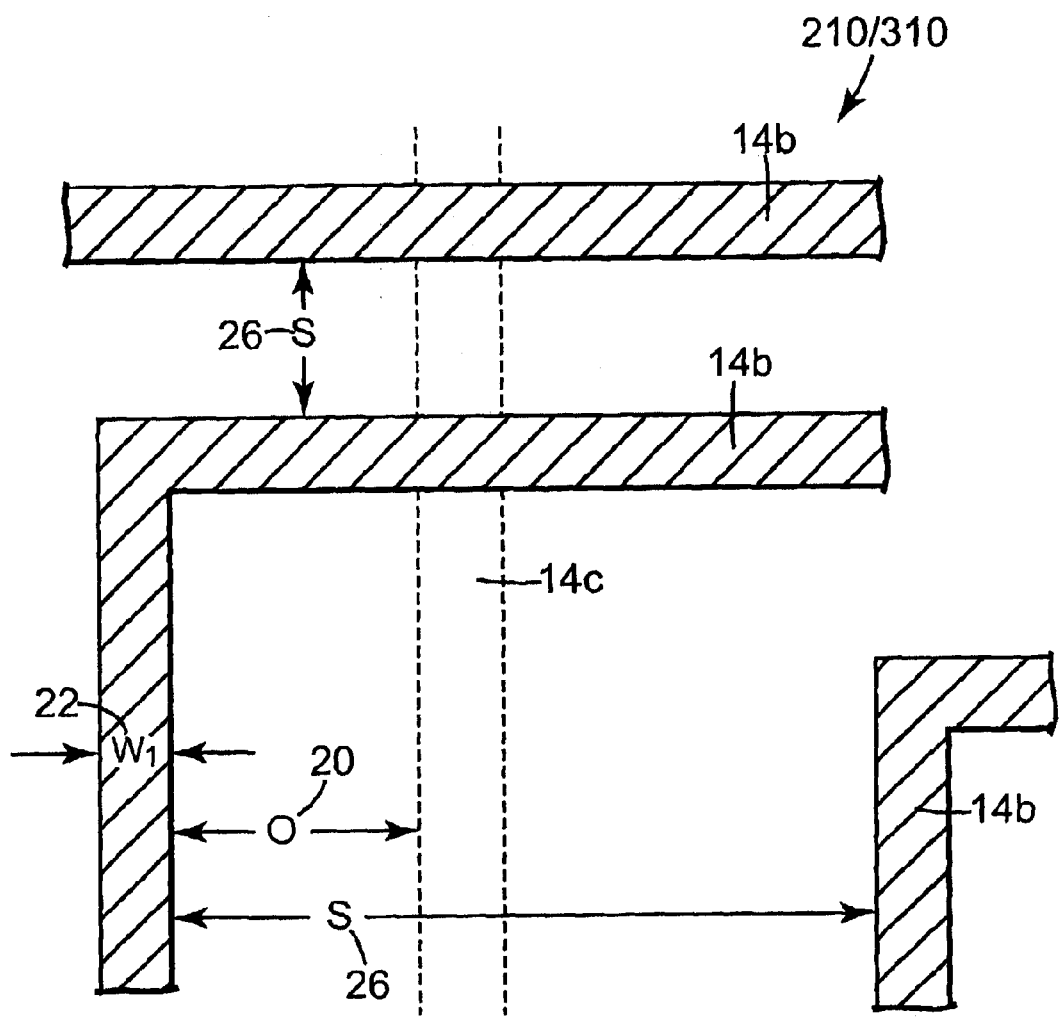
FIG. 6 is a cross sectional top view illustrating an exemplary embodiment of two signal line layers within a substrate.

FIG. 6 is a cross sectional top view illustrating an exemplary embodiment of two signal line layers within a substrate. In one embodiment, signal line layers 14 are routed using layout design rules which are valid with or without the one or more first conductive isolation layers or the one or more second conductive isolation layers. FIG. 6 illustrates a top cross section view of layers 14b and 14c of substrate 210 or substrate 310.

In one embodiment, any signal lines in adjacent signal line layer stacks 16 not separated by conductive isolation layer 18 and which are routed substantially in the same direction have a minimum offset distance (O). In the illustrated embodiment, the minimum offset distance (O) illustrated at 20 is indicated between parallel signal lines routed in signal line layers 14b and 14c. In one embodiment, the minimum offset distance (O) illustrated at 20 is 12 mils. In other embodiments, the minimum offset distance (O) illustrated at 20 is any suitable value.

In one embodiment, signal line layers 14 in adjacent signal line layer stacks 16 which are not separated by conductive isolation layer 18 and which are not routed substantially in the same direction are routed in an orthogonal direction. In the illustrated embodiment, signal lines on layers 14b and 14c are routed to cross in an orthogonal direction.

In various embodiments, the nominal width ($W_1$) illustrated at 22 for signal lines in adjacent signal line layers 14 not separated by conductive isolation layers 18 is the same or approximately the same as the nominal width ($W_2$) illustrated at 24 for signal lines in adjacent signal line layers 14 which are separated by conductive isolation layers 18. In the illustrated embodiment, width ($W_1$) illustrated at 22 is the nominal width for signal lines in layer 14b wherein layer 14b is not separated from layer 14c by conductive isolation layer 18. Although width ($W_1$) is illustrated in FIG. 1 for two signal line layers 14b and 14c which are not separated by a conductive isolation layer 18, in other embodiments, width ($W_1$) is the nominal width for more than two signal line layers 14 which are not separated by any conductive isolation layers 18. In one embodiment, the nominal width ($W_1$) illustrated at 22 is 4 mils. FIG. 1 illustrates the nominal width ($W_2$) illustrated at 24 for signal lines in adjacent signal line layer stacks 16 which are separated by conductive isolation layer 18. In one embodiment, the nominal width ($W_2$) illustrated at 24 is 3.8 mils.

In one embodiment, the minimum edge to edge spacing (S) illustrated at 26 for signal lines in the same signal line layer 14 is any suitable value. In one embodiment, the minimum edge to edge spacing (S) illustrated at 26 is 14 mils.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A reconfigurable substrate, comprising:
    at least one signal line layer stack, each signal line layer stack defined to include:
        two substantially parallel insulating layers; and
        a signal line layer interposed between the two insulating layers and substantially parallel to the insulating layers;
    a reconfigurable portion including a conductive isolation layer set selected from a group of conductive isolation layer sets including:
        a first conductive isolation layer set comprising at least one conductive isolation layer adjacent to the at least one signal line layer stack and substantially parallel to the at least one signal line layer stack; and
        a second conductive isolation layer set comprising the first conductive isolation layer set and at least one additional conductive isolation layer;
    wherein the substrate has a higher performance level when configured with the second conductive isolation layer set than when configured with the first conductive isolation layer set.

2. The reconfigurable substrate of claim 1, wherein the substrate includes at least two signal line layer stacks and at least one conductive isolation layer defined between the at least two signal line layer stacks.

3. The reconfigurable substrate of claim 1, wherein the at least one conductive isolation layer includes at least one ground line layer.

4. The reconfigurable substrate of claim 1, wherein the at least one conductive isolation layer includes at least one power line layer.

5. The reconfigurable substrate of claim 1, wherein any of the signal lines in adjacent signal line layer stacks not separated by the at least one conductive isolation layer and which are routed substantially in a same direction have a minimum offset distance.

6. The reconfigurable substrate of claim 5, wherein the minimum offset distance is 5 mils.

7. The reconfigurable substrate of claim 1, wherein any of the signal lines in the adjacent signal line layer stacks not separated by the at least one conductive isolation layer and which are not routed substantially in a same direction are routed in an orthogonal direction.

8. The reconfigurable substrate of claim 1, wherein the nominal width for the signal lines in the adjacent signal line layer stacks not separated by the at least one conductive isolation layer is approximately the same as the nominal width for the signal lines in the adjacent signal line layer stacks which are separated by the at least one conductive isolation layer.

9. The reconfigurable substrate of claim 1, wherein a difference between the nominal width for the signal lines in the adjacent signal line layer stacks not separated by the at least one conductive isolation layer and the nominal width for the signal lines in the adjacent signal line layer stacks which are separated by the at least one conductive isolation layer is equal to or less than 10%.

10. The reconfigurable substrate of claim 1, wherein the minimum edge to edge spacing for the signal lines in a same one of the signal line layers is 14 mils.

11. The reconfigurable substrate of claim 1, wherein the at least one conductive isolation layers and the signal line layers are formed of a conductive metal layer which includes copper.

12. The reconfigurable substrate of claim 1, wherein each one of the insulating layers has a relative dielectric constant of 2 to 6.

13. The reconfigurable substrate of claim 12, wherein each one of the insulating layers is formed of a material selected from a group consisting of fluororesins, polyimide resins and epoxy resins.

14. A printed circuit board, comprising:
    at least one signal line layer stack, each signal line layer stack defined to include:
        two substantially parallel insulating layer; and
        a single line layer interposed between the two insulating layers and substantially parallel to the insulating layers;
    a reconfigurable portion including a conductive isolation layer set selected from a group of conductive isolation layer sets including:
        a first conductive isolation layer set comprising at least one conductive isolation layer adjacent to the at least one signal line layer stack; and
        substantially parallel to the at least one signal line layer stack; and
        a second conductive isolation layer set comprising the first conductive isolation layer set and at least one additional conductive isolation layer,
    wherein the printed circuit board has a higher performance level when configured with the second conductive isolation layer set than when configured with the first conductive isolation layer set.

15. The printed circuit board of claim 14, wherein the at least one conductive isolation layer includes at least one ground line layer.

16. The printed circuit board of claim 14, wherein the at least one conductive isolation layer includes at least one power line layer.

17. The printed circuit board of claim 14, wherein any signal lines in adjacent signal line layer stacks not separated by the at least one conductive isolation layer and which are routed substantially in a same direction have a minimum offset distance.

18. The printed circuit board of claim 17, wherein any the minimum offset distance is 5 mils.

19. The printed circuit board of claim 14, wherein any signal lines in adjacent signal line layer stacks not separated by the at least one conductive isolation layer and which are not routed substantially in a same direction are routed in an orthogonal direction.

20. The printed circuit board of claim 14, wherein the nominal width for the signal lines in adjacent signal line layer stacks not separated by the at least one conductive isolation layer is approximately the same as the nominal width for the signal lines in the adjacent signal line layer stacks which are separated by the at least one conductive isolation layer.

21. The printed circuit board of claim 14, wherein a difference between the nominal width for the signal lines in adjacent signal line layer stacks not separated by the at least one conductive isolation layer and the nominal width for the signal lines in the adjacent signal line layer stacks which are separated by the at least one conductive isolation layer is equal to or less than 10%.

22. The printed circuit board of claim 14, wherein the minimum edge to edge spacing for the signal lines in a same one of the at least one signal line layers is 14 mils.

23. The printed circuit board of claim 14, wherein the at least one conductive isolation layer and the at least one signal line layer are formed of a conductive metal layer which includes copper.

24. The printed circuit board of claim 14, wherein each one of the insulating layers has a relative dielectric constant of 2 to 6.

25. The printed circuit board of claim 24, wherein each of the insulating layers is formed of a material selected from a group consisting of fluororesins, polyimide resins and epoxy resins.

26. A method of reconfiguring a substrate, the method comprising:

provided at least one signal line layer stack, each signal line layer stack comprising:

two substantially parallel insulating layers; and a signal line layer interposed between the two insulating layers and substantially parallel to the insulating layers;

providing at least one conductive isolation layer adjacent to the at least one signal line layer stack and substantially parallel to the at least one signal line layer stack; and reconfiguring the substrate to different performance levels by adding or removing one or more of the at least one conductive isolation layers.

27. A method of reconfiguring a printed circuit board, the method comprising:

providing at least one first conductive isolation layer;

providing at least one signal line layer group, each signal line layer group defined in include:

at least one signal line layer stack, each signal line layer stack defined to include:

at least one signal line layer; and two substantially parallel second insulating layers located on both a first side and a second side of the at least one signal line layer; and at least one second conductive isolation layer adjacent to the at least one signal line layer stack and substantially parallel to the at least one signal line layer stack; and providing at least one first insulating layer interposed between the at least one signal line layer group and the at least one first conductive isolation layer and substantially parallel to the at least one signal line layer group; and reconfiguring the printed circuit board to different performance levels by adding or removing one or more of the at least one first conductive isolation layers or one or more of the at least one second conductive isolation layers.

* * * * *